(12) United States Patent
Marx et al.

(10) Patent No.: US 11,513,135 B2
(45) Date of Patent: Nov. 29, 2022

(54) METHOD FOR AUTOMATIC FREQUENCY ADAPTATION OF A FILTER IN A CLOSED LOOP

(71) Applicant: Albert-Ludwigs-Universitat Freiburg, Freiburg (DE)

(72) Inventors: Maximilian Marx, Freiburg (DE); Daniel De Dorigo, Freiburg (DE); Yiannos Manoli, Freiburg (DE); Xavier Cuignet, Freiburg (DE)

(73) Assignee: Albert-Ludwigs-Universität Freiburg, Freiburg (DE)

( * ) Notice: Subject to any disclaimer, the term of this patent is extended or adjusted under 35 U.S.C. 154(b) by 457 days.

(21) Appl. No.: 16/682,328

(22) Filed: Nov. 13, 2019

(65) Prior Publication Data
US 2020/0150144 A1 May 14, 2020

(30) Foreign Application Priority Data
Nov. 13, 2018 (DE) .......................... 102018219333.9

(51) Int. Cl.
*H03L 7/093* (2006.01)
*G01P 3/48* (2006.01)
(Continued)

(52) U.S. Cl.
CPC ........ *G01P 3/4802* (2013.01); *G01C 19/5776* (2013.01); *H03L 7/093* (2013.01); *H03M 3/396* (2013.01)

(58) Field of Classification Search
CPC ... G01P 3/4802; G01C 19/5776; H03L 7/093; H03M 3/396
See application file for complete search history.

(56) References Cited

U.S. PATENT DOCUMENTS

| 5,729,230 A | 3/1998 | Jensen et al. | |
| 5,736,950 A * | 4/1998 | Harris | H03M 3/396 341/166 |

(Continued)

FOREIGN PATENT DOCUMENTS

| DE | 19910415 A1 | 9/2000 |
| DE | 69715527 T2 | 2/2003 |

(Continued)

OTHER PUBLICATIONS

A. Sharma, M. F. Zaman and F. Ayazi, "A sub-0.2°/hr bias drift micromechanical silicon jyroscope with automatic CMOS modematching", IEEE J. Solid-State Circuits, vol. 44, No. 5, pp. 1593-1608, May 2009.

(Continued)

*Primary Examiner* — David J Bolduc
(74) *Attorney, Agent, or Firm* — Barley Snyder (57) ABSTRACT

A method adapts a resonant frequency of a first filter of a closed control loop to a given frequency. The method includes feeding an output signal of a delta sigma modulator of the closed control loop into a frequency adaptation circuit and determining a first noise spectrum of the output signal in a first frequency band and a second noise spectrum of the output signal in a second frequency band. The first frequency band and the second frequency band are arranged symmetrically with respect to the given frequency. The method includes comparing the first noise spectrum with the second noise spectrum, generating an adaptation signal that causes a frequency adaptation of the resonant frequency if the first noise spectrum differs from the second noise spectrum, and outputting the adaptation signal from the frequency adaptation circuit to a control input of the first filter for adapting the resonant frequency.

20 Claims, 7 Drawing Sheets

(51) Int. Cl.
*H03M 3/00* (2006.01)
*G01C 19/5776* (2012.01)

(56) References Cited

U.S. PATENT DOCUMENTS

| | | | | |
|---|---|---|---|---|
| 6,654,424 | B1 | 11/2003 | Thomae et al. | |
| 6,864,818 | B1* | 3/2005 | Hezar | H03M 3/396 341/143 |
| 6,987,424 | B1* | 1/2006 | Hein | H03L 7/085 331/53 |
| 7,193,544 | B1* | 3/2007 | Fitelson | H03M 3/396 341/143 |
| 8,264,388 | B1* | 9/2012 | Cohen | H03L 7/093 331/10 |
| 8,299,826 | B2* | 10/2012 | Perrott | H03L 7/085 327/147 |
| 8,446,191 | B2* | 5/2013 | Dunworth | H03L 7/093 327/147 |
| 2005/0030211 | A1* | 2/2005 | Dias | H03M 3/396 341/143 |
| 2006/0055580 | A1* | 3/2006 | Ortmanns | H03M 3/372 341/166 |
| 2006/0197611 | A1* | 9/2006 | Yan | H03L 7/193 331/16 |
| 2008/0007346 | A1* | 1/2008 | Jensen | H03L 7/093 331/16 |
| 2009/0085679 | A1* | 4/2009 | Jennings | H03L 7/0893 331/1 A |
| 2010/0264993 | A1* | 10/2010 | Wang | H03L 7/093 331/1 A |
| 2012/0082151 | A1* | 4/2012 | Liu | H03L 7/1976 370/342 |
| 2013/0197858 | A1* | 8/2013 | Egretzberger | G01C 19/5712 702/145 |
| 2014/0060185 | A1* | 3/2014 | Rombach | G01C 19/56 73/504.12 |
| 2014/0354335 | A1* | 12/2014 | Syllaios | H03L 7/193 327/157 |
| 2014/0354336 | A1* | 12/2014 | Syllaios | H03L 7/193 327/156 |
| 2015/0122022 | A1* | 5/2015 | Maki | G01C 19/5614 73/504.16 |
| 2015/0268262 | A1* | 9/2015 | Rombach | G01P 1/04 73/504.12 |
| 2016/0072472 | A1* | 3/2016 | Fedder | G01L 1/10 318/116 |
| 2016/0202061 | A1* | 7/2016 | Maurer | G01C 19/5726 73/504.12 |
| 2017/0093412 | A1* | 3/2017 | Van Brunt | H03L 7/1974 |
| 2017/0102248 | A1* | 4/2017 | Maurer | G01C 25/005 |
| 2017/0276484 | A1 | 9/2017 | Marx et al. | |
| 2018/0128674 | A1 | 5/2018 | Kook et al. | |
| 2018/0175868 | A1* | 6/2018 | Stuhlberger | H03L 7/0816 |
| 2018/0241406 | A1* | 8/2018 | Cherniak | H03B 5/1215 |
| 2018/0321065 | A1* | 11/2018 | Vergauwen | H03L 7/093 |
| 2019/0280698 | A1* | 9/2019 | Kearney | H03L 7/0814 |
| 2019/0384351 | A1* | 12/2019 | J | H03L 7/093 |

FOREIGN PATENT DOCUMENTS

| | | |
|---|---|---|
| DE | 102016204683 B3 | 7/2017 |
| EP | 2466257 A1 | 6/2012 |

OTHER PUBLICATIONS

S. Sonmezoglu, S. E. Alper and T. Akin, "An Automatically Mode-Matched MEMS Gyroscope With Wide and Tunable Bandwidth", Journal of Microelectromechanical Systems, vol. 23, No. 2, pp. 284-297, Apr. 2014.

S. Sung, W. T. Sung, C. Kim, S. Yun and Y. J. Lee, "On the Mode-Matched Control of MEMS Vibratory Gyroscope via Phase-Domain Analysis and Design", IEEE/ASME Transactions on Mechatronics, vol. 14, No. 4, pp. 446-455, Aug. 2009.

C. He et al., "A MEMS Vibratory Gyroscope With Real-Time Mode-Matching and Robust Control for the Sense Mode", IEEE Sensors Journal, vol. 15, No. 4, pp. 2069-2077, Apr. 2015.

Michael Maurer, Stefan Rombach, Yiannos Manoli, "Resonance Frequency Control and Digital Correction for Capacitive MEMS Gyroscopes within electromechanical Bandpass Delta-Sigma-Modulators", 2018 IEEE International Symposium on Inertial Sensors and systems (INERTIAL), pp. 61-64.

German Search Report, Appl No. 102018219333.9, dated Aug. 1, 2019, 14 pages.

Yun-Shiang Shu; Bang-Sup Song; Bacrania, K., "A 65nm CMOS CT ΔΣ Modulator with 81 dB DR and 8MHz BW Auto-Tuned by Pulse Injection", Solid-State Circuits Conference, 2008. ISSCC 2008. Digest of Technical Papers, IEEE International, pp. 500-631, 3.-7. Feb. 2008.

T Northemann, M. Maurer, S Rombach, A. Buhmann, Y Manoli: "Drive and sense interface for gyroscopes based on bandpass sigma-delta modulators", Proc. IEEE Int. Circuits and Systems (ISCAS) Symp, pp. 3264-3267, 2010.

Huanzhang Huang; Lee, E.K.F., "Frequency and Q tuning techniques for continuous-time bandpass sigma-delta modulator", ISCAS 2002. IEEE International Symposium on Circuits and Systems, vol. 5, No. S.V-589-V-592, 2002.

* cited by examiner

METHOD FOR AUTOMATIC FREQUENCY ADAPTATION OF A FILTER IN A CLOSED LOOP

CROSS-REFERENCE TO RELATED APPLICATION

This application claims the benefit of the filing date under 35 U.S.C. § 119(a)-(d) of German Patent Application No. 102018219333.9, filed on Nov. 13, 2018.

FIELD OF THE INVENTION

The present invention relates to a filter and, more particularly, to automatic frequency adaptation of a filter during operation in a closed control loop.

BACKGROUND

A rotation rate sensor is used, for example, in driver assistance systems, navigation systems and increasingly in mobile battery-powered devices, such as smartphones or tablet computers. Microelectromechanical (MEM) Coriolis rotation rate sensors (Coriolis Vibratory Gyroscope (CVG)) have a moving mechanical structure that is excited to a periodic oscillation. This periodic oscillation generated by excitation is also referred to as primary oscillation. If the sensor undergoes rotation about an axis perpendicular to the primary oscillation or primary movement, the movement of the primary oscillation leads to a Coriolis force proportional to the measured variable, i.e. the angular velocity. This axis is referred to as the sensitive axis of the sensor. The Coriolis force excites a second oscillation orthogonal to the primary oscillation. This second oscillation, orthogonal to the primary oscillation, is also referred to as secondary oscillation or secondary movement. The secondary oscillation, which is also referred to as detection oscillation, can be recorded by various measurement methods, the recorded quantity serving as a measure for the rotation rate acting on the rotation rate sensor. The methods used for generating the primary oscillation are, inter alia, thermal, piezoelectric, electrostatic and inductive methods, which are known in the prior art. For recording the secondary oscillation, piezoelectric, piezoresistive or capacitive principles are known in the prior art.

Rotation rate sensors detect rotation rates about a defined sensitive axis based on the Coriolis effect. The rotation rate sensor comprises a primary and a secondary mass. In order to allow detection of a rotation rate making use of the Coriolis effect, the entire mass must be set in motion. The primary mass, in which the secondary mass is suspended, is set into constant oscillation with its resonant frequency e.g. by electrostatic actuation. Due to a rotation of the sensor about the sensitive axis, the Coriolis force $F_c$ acts on the secondary mass orthogonal to the primary axis according to the following equation (1), so that the secondary mass is deflected.

$$\vec{F}_c = -2m\vec{\Omega} \times \vec{v}_p \quad (1),$$

where m is the secondary mass, $\Omega$ is the rotation rate and $v_p$ is the velocity of the primary mass. The secondary mass ideally is suspended mechanically in such a way that it can deflect only orthogonally to the primary oscillation. A large amplitude of the primary oscillation is desirable in order to accomplish high sensitivity. The primary mass is here usually excited resonantly and the amplitude of the oscillation is controlled by automatic gain control (AGC), as known from the article T. Northemann, M. Maurer, S. Rombach, A. Buhmann, Y. Manoli: "Drive and sense interface for gyroscopes based on bandpass sigma-delta modulators", Proc. IEEE Int. Circuits and Systems (ISCAS) Symp, pages 3264-3267, 2010.

Figure 1:
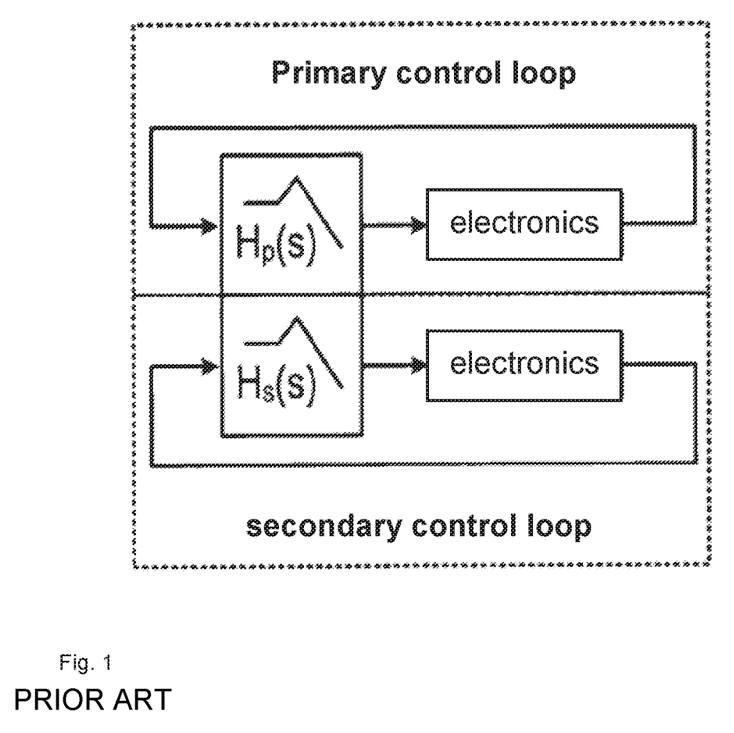
FIG. 1 is a block diagram of a rotation rate sensor according to the prior art.

FIG. 1 shows schematically a rotation rate sensor with a primary control loop for the drive and a secondary control loop for reading the signal. In order to accomplish high linearity, large bandwidths and reduced sensitivity to process fluctuations, these sensors are operated with feedback on both the primary and the secondary side, as shown in FIG. 1. In the secondary control loop the effective Coriolis force $\vec{F}_c$ is compensated by applying a resetting capacitive force according to equation (2) following hereinafter:

$$\vec{F}_C = \vec{F}_{es} \quad (2)$$

Figure 2:
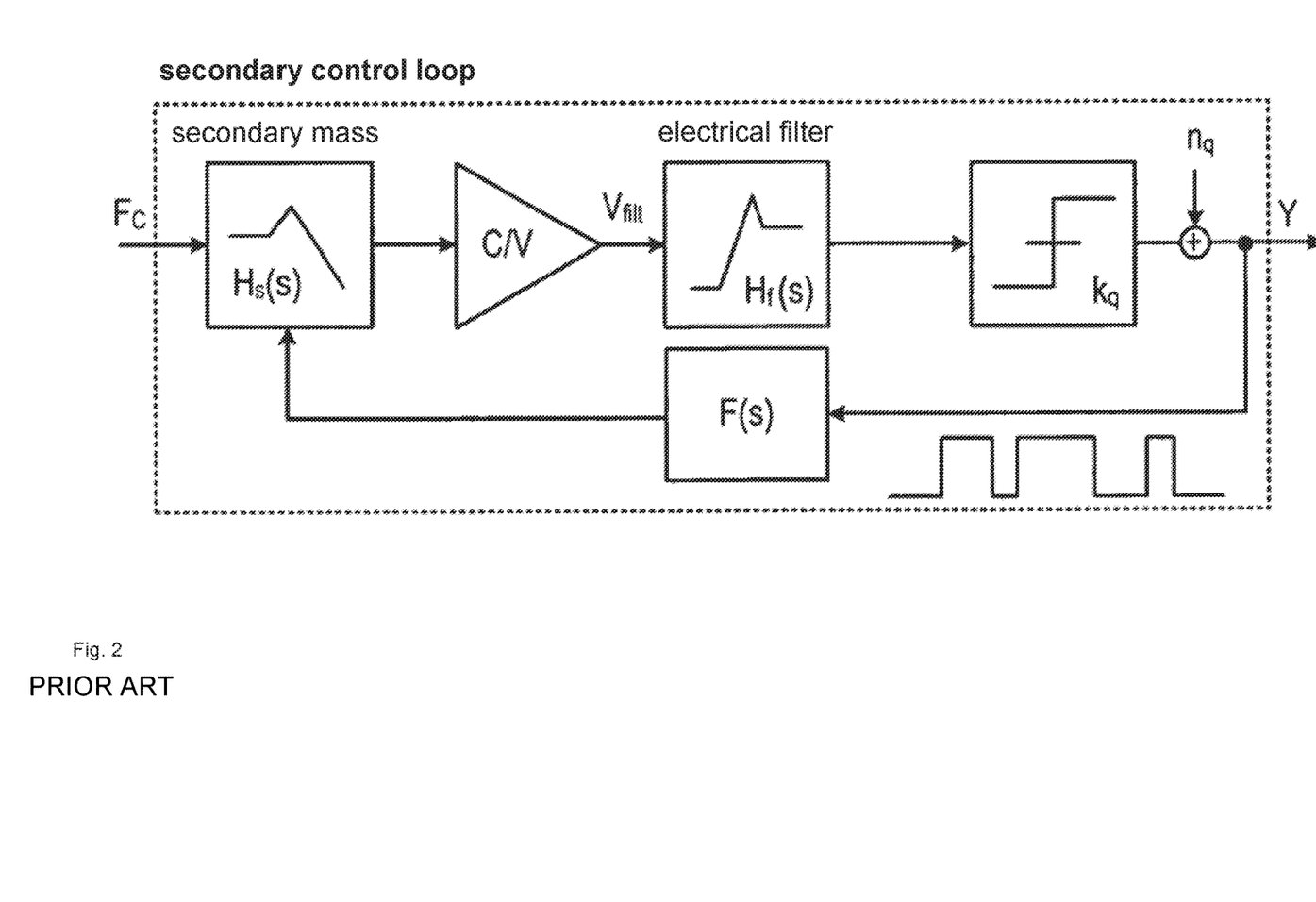
FIG. 2 is a block diagram of a secondary control loop for operating a rotation rate sensor according to the prior art.

In this way, the secondary mass remains at the rest position and the generated force $\vec{F}_{es}$ constitutes a direct measure for the rotation rate acting on the system.

a. The required compensation signal is usually generated by embedding the sensor in a closed control loop of a delta sigma modulator (also abbreviated as $\Delta\Sigma M$ hereinafter). FIG. 2 schematically shows a simplified block diagram of a secondary control loop for operating a rotation rate sensor based on delta sigma modulation. In this way, the output signal is directly digitized with high resolution and a high linearity is accomplished.

$\Delta\Sigma Ms$ are based on noise shaping, inter alia. This means that, by filters provided within the modulator, the quantization noise $n_q$ generated at the output is suppressed in the signal band and shifted towards other frequencies. When realizing an electromechanical $\Delta\Sigma M$, an additional electronic filter is often used for noise shaping, in addition to the actual mechanical sensor element $H_s(s)$, which can be regarded as a mechanical filter, this electronic filter being also shown in FIG. 2. This filter $H_f(s)$ is typically configured as a bandpass filter. This results in the noise transfer function (NTF) according to equation (3) and the signal transfer function (STF) according to equation (4), which follow hereinafter.

$$NTF = \frac{Y}{n_q} = \frac{1}{1 + F(s)k_q H_s(s) H_f(s)} \quad (3)$$

$$STF = \frac{Y}{F_C} = \frac{k_q H_s(s) H_f(s)}{1 + F(s)k_q H_s(s) H_f(s)} \approx \frac{1}{F(s)}, \quad (4)$$

where Y is the output signal of the $\Delta\Sigma M$, $k_q$ a quantization constant, F(s) the transfer function of the feedback, $H_f(s)$ the transfer function of the electrical filter, $H_s(s)$ the transfer function of the secondary mass.

Figure 3A:
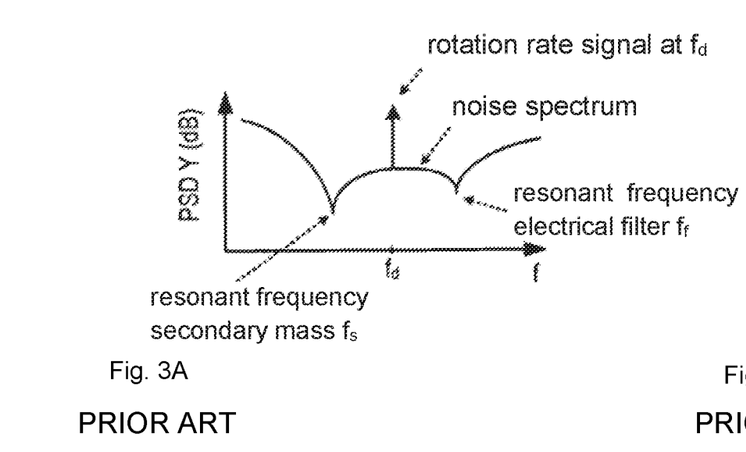
FIG. 3A is a graph of a spectral power density of an output of the secondary control loop of FIG. 2A in a case where a primary resonant frequency of a rotation rate sensor, a secondary resonant frequency of the rotation rate sensor, and a filter frequency of an electrical filter of a delta sigma modulator are mismatched.
Figure 3B:
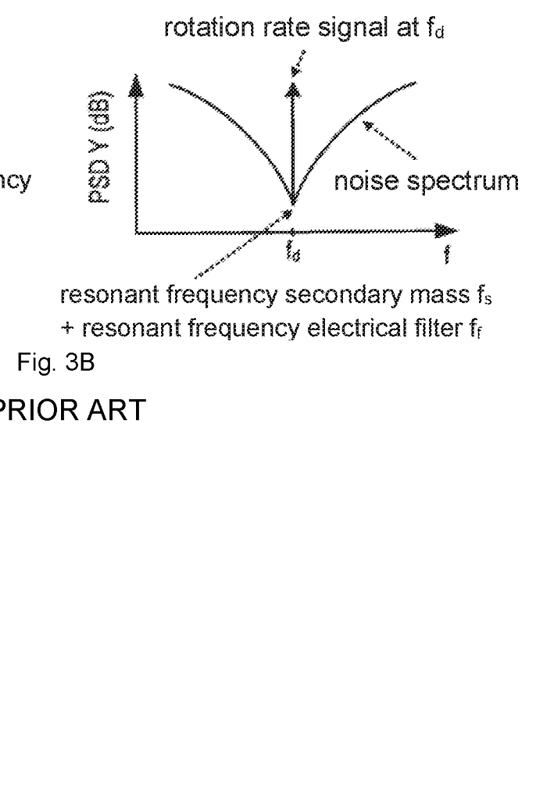
FIG. 3B is a graph of the spectral power density of the output of the secondary control loop of FIG. 2A in a case where the primary resonant frequency, the secondary resonant frequency, and the filter frequency match.

In order to accomplish the best possible signal-to-noise ratio (SNR) and a high stability of the working point, the resonant frequency $f_s$ of the secondary mass (secondary resonant frequency) and the resonant frequency $f_f$ of the electrical filter $H_f(s)$ must match very precisely with the primary resonant frequency of the rotation rate sensor $f_d$ having the rotation rate signal modulated thereon. The typical power spectrum of the output Y of a $\Delta\Sigma M$ is shown in FIG. 3A and 3B for cases where the frequencies $f_d$, $f_s$ and $f_f$ do not match (FIG. 3A) and match (FIG. 3B), respectively. The SNR is significantly higher in the case of matching frequencies.

Hence, it is necessary to adapt the secondary resonant frequency $f_s$. This is necessary because large fluctuations of the resonant frequency $f_s$ of the secondary masses occur during the production of the sensor and during operation under the influence of temperature changes. In addition, also the primary resonant frequency of rotation rate sensors $f_d$ may vary greatly. These fluctuations necessitate, on the one hand, that the sensor readout circuits have to be adjusted initially and, on the other hand, that fluctuations occurring during operation must be compensated for.

Figure 4:
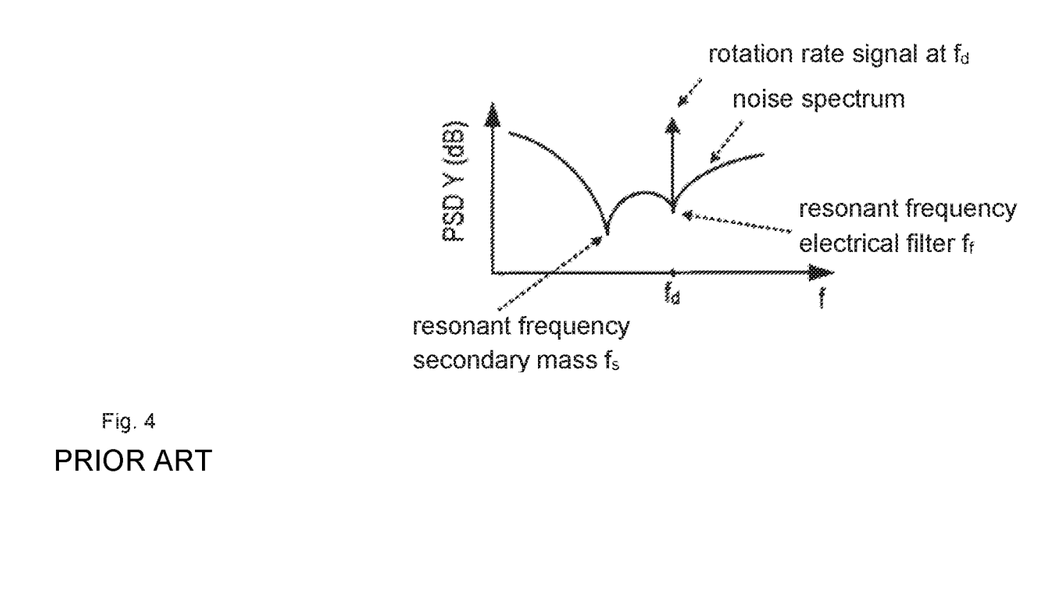
FIG. 4 is a graph of the spectral power density of the output of the secondary control loop of FIG. 2A after an optimum adaptation of the filter frequency of the electrical filter to the primary resonant frequency and in a case where the secondary resonant frequency is mismatched.

In the prior art, various concepts for adapting the resonant frequency $f_f$ of the electrical filter are known, as disclosed in German Patent Application No. 102016204683 and references therein. In the following it will be assumed that the resonant frequency $f_f$ of the electrical filter has already been adapted to the primary resonant frequency $f_d$ of the rotation rate sensor, e.g. by means of the method described in DE 10 2016 204683. This results in a typical power spectrum of the output Y of the electromechanical $\Delta\Sigma M$, of the type shown in FIG. 4, in which the frequency $f_s$ is too low.

In order to avoid a reduction of the SNR, the frequency $f_s$ of the secondary mass must be set very accurately. The error between the primary $f_d$ and the secondary $f_s$ resonant frequency of the sensor should be less than the bandwidth BW of the rotation rate signal. For example, typical values for the bandwidth BW=50 Hz and the primary sensor resonant frequency $f_d$=10 kHz lead to a high demanded relative accuracy of 0.5%. With regard to the stability of the working point and thus the zero point error of the sensor, even higher demands in the range of less than 0.1% $f_d$ may have to be satisfied.

In principle, the resonant frequency $f_s$ of the secondary resonator of the rotation rate sensor can be set by means of the so-called "spring softening" effect. The sensor has special capacitances for this purpose. If a voltage $V_f$ is applied to these capacitances, the non-linear relationship between voltage and electrostatic force will cause, among other things, a force component that scales linearly with the deflection of the secondary mass. Since this correlation is equivalent to a mechanical spring constant $k_{mech}$, this can be described as an additional electrostatic spring force $k_{el}$. The effective spring constant $k_{eff}=k_{mech}-k_{el}\sim k_{mech}-V_f^2$ and thus the resonant frequency $f_s=(k_{eff}/m)^{1/2}$ of the secondary mass m decrease as the applied voltage $V_f$ increases.

The prior art discloses methods for adapting the secondary resonant frequency of a rotation rate sensor, if the latter is not, or not completely operated in a closed control loop. For example, an article by A. Sharma, M. F. Zaman and F. Ayazi, "A sub-0.2°/hr bias drift micromechanical silicon gyroscope with automatic CMOS modematching", *IEEE J. Solid-State Circuits*, Vol. 44, No. 5, pages 1593-1608, May 2009, and an article by S. Sonmezoglu, S. E. Alper and T. Akin, "An Automatically Mode-Matched MEMS Gyroscope With Wide and Tunable Bandwidth", *Journal of Microelectromechanical Systems*, Vol. 23, No. 2, pages 284-297, April 2014, describe a method based on maximizing an offset signal of the rotation rate sensor.

According to the teaching in S. Sung, W. T. Sung, C. Kim, S. Yun and Y. J. Lee, "On the Mode-Matched Control of MEMS Vibratory Gyroscope via Phase-Domain Analysis and Design", *IEEE/ASME Transactions on Mechatronics*, Vol. 14, No. 4, pages 446-455, August 2009, the secondary mass of the sensor is actively excited at the resonant frequency of the primary mass and the resultant phase difference is used as a measured variable for the resonant frequency of the secondary mass. Also C. He et al., "A MEMS Vibratory Gyroscope With Real-Time Mode-Matching and Robust Control for the Sense Mode", *IEEE Sensors Journal*, Vol. 15, No. 4, pages 2069-2077, April 2015, describes that the secondary mass is excited outside the closed loop in order to characterize the frequency response. According to these approaches, it is not possible to use the sensor in closed control loops during operation and thus to continuously adapt the resonant frequencies, e.g. under the influence of temperature changes.

In Huanzhang Huang; Lee, E.K.F., "Frequency and Q tuning techniques for continuous-time bandpass sigma-delta modulator", *ISCAS* 2002. *IEEE International Symposium on Circuits and Systems*, Vol. 5, No., S.V-589 - V-592, 2002, the principle of a circuit for frequency adaptation of an electrical filter in an exclusively electrical $\Delta\Sigma M$ is described. Two different approaches for determining the noise power at the output of the modulator at two discrete points $f_a$ and $f_b$, respectively, which lie above and below the actual signal frequency with respect to $f_d$, are presented. Since the electrical filter influences the noise power at these discrete frequencies differently, depending on the position of its resonant frequency, the magnitude of the two noise powers can be used for determining whether the filter resonant frequency is too high or too low. The teaching is limited to the adaptation of the frequency of electrical filters and the control is relatively slow and inaccurate with a high space requirement for the implementation.

Other methods for determining the secondary resonant frequency use test signals that are fed into the control loop after the secondary resonator (cf. for example Yun-Shiang Shu; Bang-Sup Song; Bacrania, K., "A 65 nm CMOS CT $\Delta\Sigma$ Modulator with 81 dB DR and 8 MHz BW Auto-Tuned by Pulse Injection", *Solid-State Circuits Conference*, 2008. *ISSCC* 2008. *Digest of Technical Papers*, IEEE International, pages 500-631, 3.-7. February 2008; Michael Maurer, Stefan Rombach, Yiannos Manoli, "Resonance Frequency Control and Digital Correction for Capacitive MEMS Gyroscopes within electromechanical Bandpass Delta-Sigma-Modulators", 2018 *IEEE International Symposium on Inertial Sensors and Systems (INERTIAL)*, pages 61-64; DE 199 10415 A1, US2018/0128674 A1 and EP 2 466 257 A1). This allows the resonant frequency of the secondary mass $f_s$ to be set by testing how the test signal is suppressed by the transfer function at the digital output of the modulator. Depending on the phase position and the magnitude of the remaining test signal at the output, it can be inferred whether the resonant frequency $f_s$ is too high or too low. A digital controller readjusts the secondary resonant frequency $f_s$ of the sensor via electrostatic actors at the sensor accordingly. This method entails the disadvantage of a higher space requirement for the evaluation of the test signals and, depending on the respective implementation, a considerable additional space requirement for generating the test signals and for feeding them into the readout loop. Moreover, the test signals must be generated and fed into the readout loop precisely and with low noise, so as not to disturb the latter.

SUMMARY

A method adapts a resonant frequency of a first filter of a closed control loop to a given frequency. The method includes feeding an output signal of a delta sigma modulator of the closed control loop into a frequency adaptation circuit and determining a first noise spectrum of the output signal in a first frequency band and a second noise spectrum of the output signal in a second frequency band. The first frequency band and the second frequency band are arranged symmetrically with respect to the given frequency. The method includes comparing the first noise spectrum with the second noise spectrum, generating an adaptation signal that causes a frequency adaptation of the resonant frequency if the first noise spectrum differs from the second noise spectrum, and outputting the adaptation signal from the frequency adaptation circuit to a control input of the first filter for adapting the resonant frequency.

BRIEF DESCRIPTION OF THE DRAWINGS

The invention will now be described by way of example with reference to the accompanying Figures, of which.

DETAILED DESCRIPTION OF THE EMBODIMENT(S)

For making the present invention more easily understandable, it will be explained in more detail on the basis of the embodiments shown in the figures following hereinafter. Like components are here provided with like reference numerals and like component designations. In addition, also individual features or combinations of features from the depicted and described embodiments may, when considered individually, represent independent inventive solutions or solutions according to the present invention.

The present invention will now be described in greater detail with reference to FIGS. 5A, 5B, 6, and 7. While the present invention can generally be used for adapting any kind of filters where a broadband excitation of the filters takes place and a transfer function of the filters is approximated on the basis of one of the signals in the application environment, and while the invention can be used for analog-to-digital converters with closed control loops, e.g. delta sigma modulator analog-to-digital converters, the use for rotation rate sensors will be considered in detail hereinafter. Other sensors for which the present invention can be used comprise e.g. Lorentz force magnetic field sensors.

The frequency adaptation principle according to the present invention is here based on an evaluation of the noise shaping (determination of the noise spectrum) of a closed secondary control loop at the output Y of a $\Delta\Sigma M$ in a differential band with respect to the primary resonant frequency $f_d$ (of a filter or a mechanical resonator $H_p(s)$), frequency bands, which have been determined symmetrically to the primary resonant frequency $f_d$, being here demodulated individually into the baseband, so that the noise power or the signal strength in the two symmetrically determined bands can be compared with each other. This makes it possible to accurately determine whether the current secondary resonant frequency $f_s$ is too high or too low in comparison with the primary resonant frequency $f_d$, and to generate a signal for setting the secondary resonant frequency $f_s$. This setting signal is then fed back to the secondary mass m of the sensor, and the secondary resonant frequency $f_s$ is set making use of the spring softening effect.

In view of the differential approach in the frequency range, the setting process will not be interfered with by an existing rotation rate signal $F_C$. Due to the two sidebands of the amplitude-modulated rotation rate signal $F_C$, a respective component occurs equally in the $f_d+f_l$ and $f_d-f_l$ path, respectively. In addition, the rotation rate signal can be suppressed by appropriate filters after demodulation. It follows that the frequency adaptation can work in the background during operation, even if parts of a rotation rate signal $F_C$ occur in one of the two bands determined symmetrically to the primary resonant frequency.

Figure 5A:
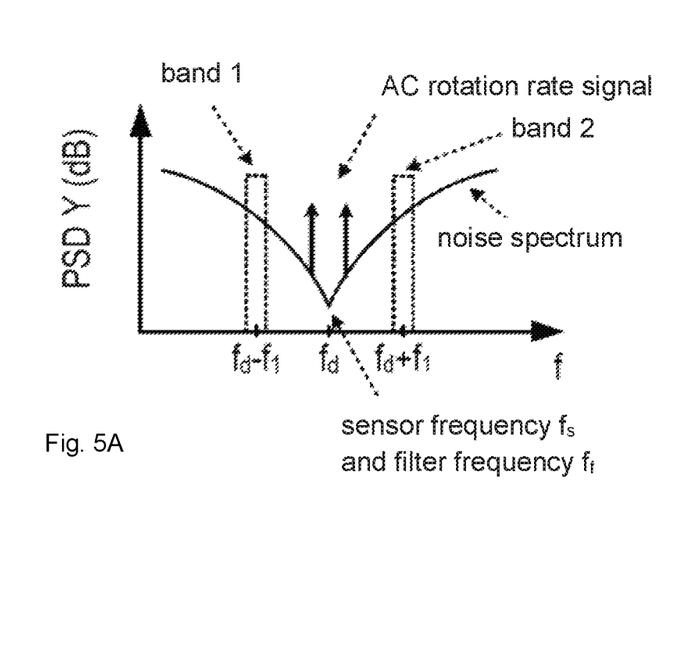
FIG. 5A is a graph of the spectral power density of the output of the secondary control loop after an optimum adaptation of a secondary resonant frequency of a rotation rate sensor as well as the frequency bands demodulated into a baseband according to the present invention.
Figure 5B:
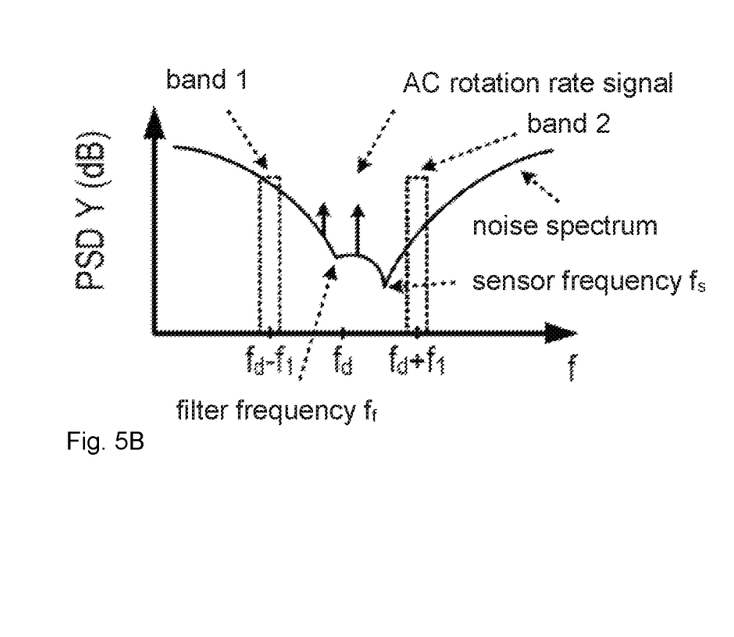
FIG. 5B is a graph of the spectral power density of the output of the secondary control loop in a case where the secondary resonant frequency of the rotation rate sensor to be adapted is mismatched as well as the frequency bands to be demodulated into the baseband according to the present invention.

FIGS. 5A and 5B show exemplarily the curve of the spectral power density of the output Y of the $\Delta\Sigma M$ and thus of the secondary control loop as a function of the frequency f. The output signal satisfies here the above described formula (3); the quantization noise $n_q$ may here be approximated by white noise, by way of example. FIG. 5A schematically illustrates the case where optimum adaptation $f_d=f_s=f_f$ has taken place, whereas FIG. 5B shows an example where the secondary resonant frequency $f_s$ is mismatched with the primary resonant frequency $f_d$ ($f_d<f_s$ in the example shown). According to the present invention, the noise power or the signal strength in a first frequency band (band 1) and in a second frequency band (band 2), which are arranged symmetrically with respect to the primary resonant frequency $f_d$ with a predetermined bandwidth with respect to $f_d+f_l$ or $f_d-f_l$, are compared with each other. In the event that $f_d=f_s=f_f$, the curve of the power spectrum extends symmetrically with respect to the resonant frequency $f_d$ of the primary oscillation and the difference between the values for the power density spectrum of band 1 and band 2 disappears (see FIG. 5A). If, however, a differential signal is formed for the bands 1 and 2 in the power density spectrum shown in FIG. 5B, this signal is not equal to zero and can be used to generate an adaptation signal for the input of the filter $H_s$ for the secondary mass m, as will be explained in more detail hereinafter with respect to FIG. 6.

Figure 6:
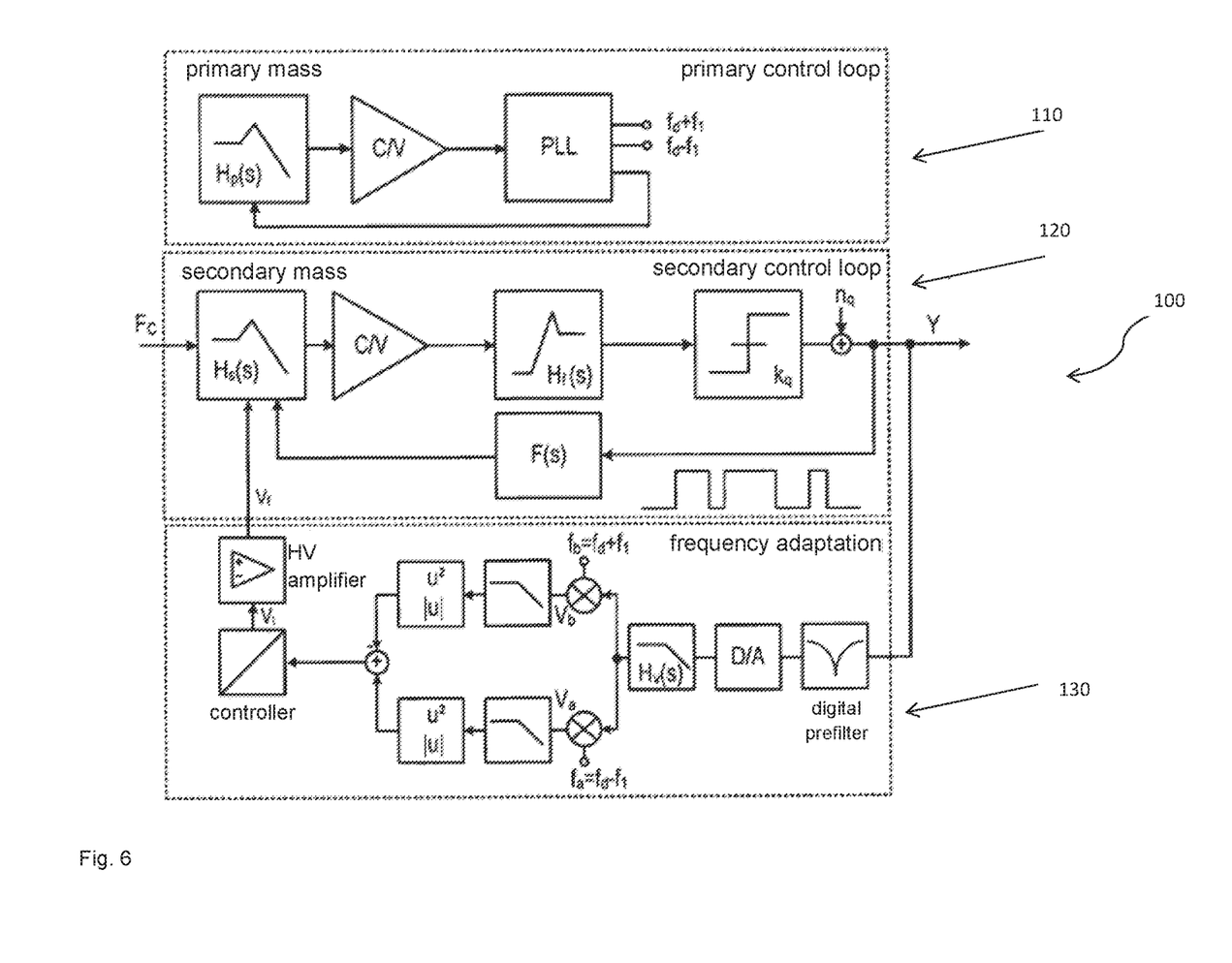
FIG. 6 is a block diagram of a rotation rate sensor with a frequency adaptation circuit according to an embodiment of the present invention.

FIG. 6 shows a rotation rate sensor 100 comprising a primary control loop 110, a secondary control loop 120, and a frequency adaptation circuit 130 according to an embodiment of the present invention. Signals with frequencies $f_a=f_d+f_l$ and $f_b=f_d-f_l$ can be provided by a phase-locked control loop PLL (which comprises an oscillator) of the primary control loop 110, these signals thus exhibiting a positive or a negative frequency shift with respect to the primary resonant frequency $f_d$.

As shown in FIG. 6, an output signal Y of the secondary control loop 120 is fed into an optional digital prefilter of the frequency adaptation circuit 130 and converted into an analog signal. The analog signal is pre-amplified in a filter $H_v(s)$ and frequencies that lie above the primary resonant frequency $f_d$ by more than a predetermined threshold are suppressed in this filter. In the next step, the signal will be demodulated by means of two multipliers and the frequencies $f_a=f_d+f_l$ and $f_b=f_d-f_l$ so as to further evaluate the resultant baseband signals. The multiplication has the effect that signals with frequencies that had previously been above or below $f_d$ by $f_l$ now appear at 0 Hz (DC). This allows other signal components to be removed very easily with downstream low-pass filters. The frequencies $f_{a,b}$ may be applied to the multipliers either by sinusoidal voltages or, in order to reduce the complexity, by rectangular voltages.

In the following step, either the power or the signal strength of both signals is measured by squaring or approximated by absolute value formation, and, subsequently, the difference between the powers or signal strengths is formed. The difference variable serves as an error value for a controller that advantageously has an I term. The controller may either be operated continuously or may be reset periodically in combination with sign evaluation and a digital logic unit. It will be advantageous to store the value for the control variable $V_t$ obtained after the initial adjustment, so as to obtain the correct secondary resonant frequency $f_s$ adapted to the primary resonant frequency $f_d$, more quickly during a subsequent start. Finally, the voltage $V_t$ is fed back to the electrodes as a control variable via an amplifier, which typically operates in the high-voltage range (voltage higher than the standard supply voltage of the chip), for setting the secondary resonant frequency $f_s$ of the sensor 100.

Figure 7:
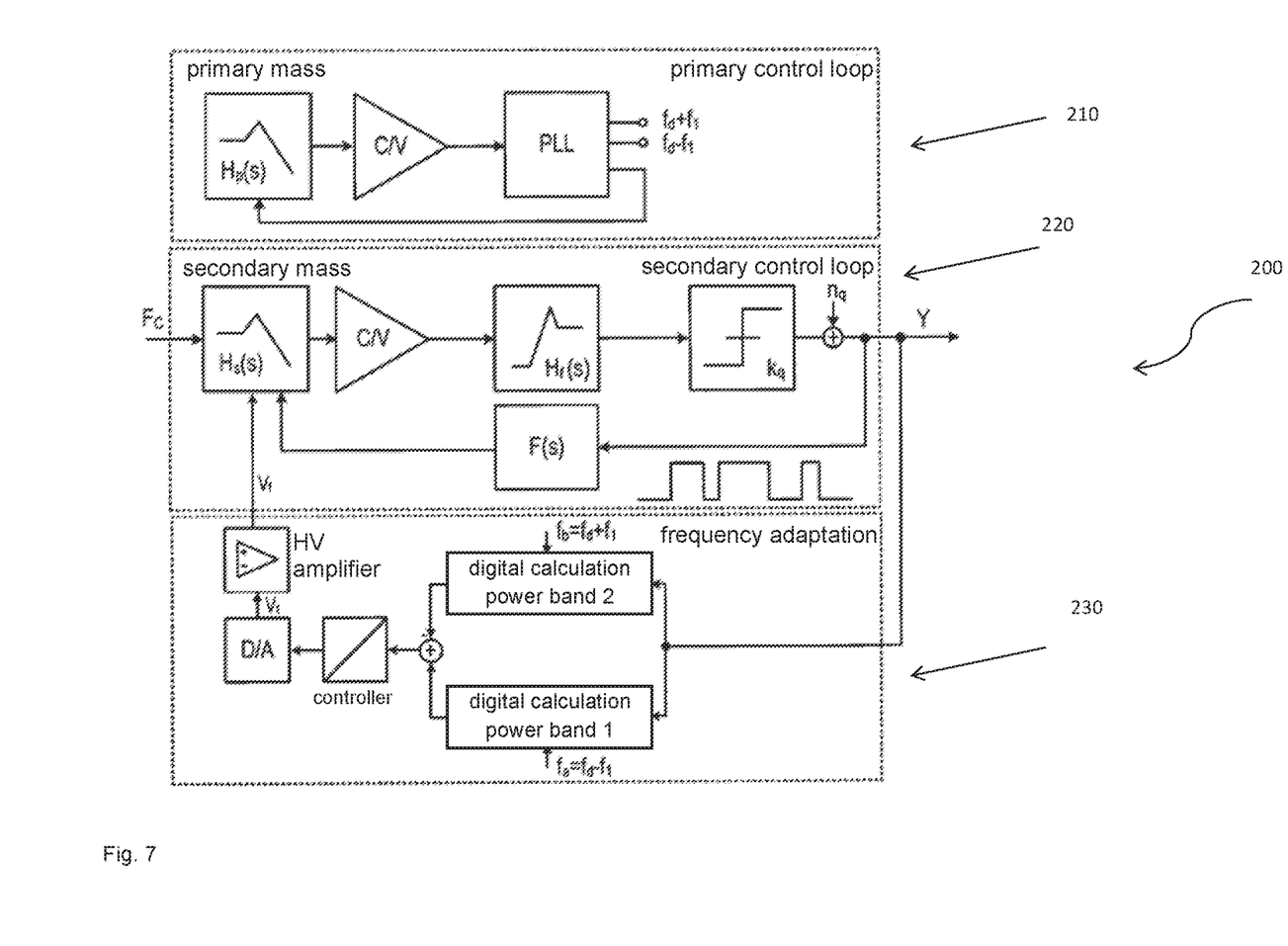
FIG. 7 is a block diagram of a rotation rate sensor with a frequency adaptation circuit according to another embodiment of the present invention.

While the method according to the present invention takes place with analog signal processing for frequency adaptation in the embodiment shown in FIG. 6, FIG. 7 shows an embodiment in the case of which an implementation with digital signal processing for frequency adaptation is carried out. The rotation rate sensor 200 shown in FIG. 7 comprises a primary control loop 210, a secondary control loop 220, and a frequency adaptation circuit 230. However, unlike in the case of the embodiment shown in FIG. 6, the output signal Y of the secondary control loop 220 is not initially converted into an analog signal in the frequency adaptation circuit 230, but the above-described calculation of the power or signal strength in bands 1 and 2 and of the difference therebetween is executed in the digital range. Again, the difference serves as an error value for a controller and the respective signal output by the controller serves, after having been converted into an analog signal $V_t$ and after amplification of the latter, as a control variable for setting the secondary resonant frequency $f_s$ of the sensor 200. Digital signal processing can be executed equivalently to analog signal processing, or more complex methods, based e.g. on the Goertzel algorithm, can be used to extract the noise power.

The present invention is based, inter alia (in particular in connection with the resonance adaptation of rotation rate sensors; more generally, the task is to be seen in adapting the frequency of a filter upstream of the electrical filter $H_f$), on the task of adapting the resonant frequency $f_s$ of the secondary mass automatically and during operation to the primary resonant frequency $f_d$ of the rotation rate sensor. The method provided is based on the evaluation of the noise shaping of the closed control loop at the output of the $\Delta\Sigma M$ in a differential band with respect to the primary resonant frequency $f_d$. The noise spectrum of the output signal of the closed control loop is ascertained for two frequency bands determined approximately symmetrically to the primary resonant frequency as a given frequency value, and a frequency adaptation is executed based on an ascertained difference in the noise spectra.

The present invention provides a structural design with a minimum additional investment in circuit technology and low space requirements. In addition, by including a large noise signal band, the frequency adaptation accomplished is significantly faster and more accurate than in cases where discrete signal components in the spectrum of the output Y of the secondary control loop are considered. Since, for this purpose, neither any additional signals have to be fed into the secondary control loop nor is it necessary to separate the secondary control loop for a short time, the functionality for signal readout cannot be impaired.

As has already been mentioned, the field of use of the present invention is not limited to rotation rate sensors alone. The invention is also applied for operating other sensors, such as acceleration sensors, Lorentz force magnetic field sensors, etc.. In addition, especially frequency adaptation during operation can also be used for analog-to-digital converters with closed control loops (e.g. $\Delta\Sigma M$-ADC). Furthermore, the concept can be used with any type of filters in the case of which broadband excitation of the filter takes place and the transfer function of the filter is thus approximated on the basis of one of the signals in the application environment.

What is claimed is:

1. A method for adapting a resonant frequency of a first filter of a closed control loop to a given frequency, comprising:
    feeding an output signal of a delta sigma modulator of the closed control loop into a frequency adaptation circuit;
    determining a first noise spectrum of the output signal of the delta sigma modulator in a first frequency band and a second noise spectrum of the output signal of the delta sigma modulator in a second frequency band in the frequency adaptation circuit, the first frequency band and the second frequency band are arranged symmetrically with respect to the given frequency;
    comparing the first noise spectrum in the first frequency band with the second noise spectrum in the second frequency band;
    generating an adaptation signal that causes a frequency adaptation of the resonant frequency if the first noise spectrum differs from the second noise spectrum; and
    outputting the adaptation signal from the frequency adaptation circuit to a control input of the first filter for adapting the resonant frequency.

2. The method of claim 1, wherein in the comparing step, the first frequency band and the second frequency band are each demodulated individually into a baseband.

3. The method of claim 2, wherein in the comparing step, a noise power in the first frequency band is compared with a noise power in the second frequency band or a signal strength in the first frequency band is compared with a signal strength in the second frequency band.

4. The method of claim 1, wherein the first frequency band with a predetermined width is determined with respect to a first frequency and the second frequency band with a predetermined width is determined with respect to a second frequency.

5. The method of claim 4, wherein the first frequency and the second frequency are provided by a further closed control loop having a second filter or a mechanical resonator with the given frequency as a further resonant frequency.

6. The method of claim 5, wherein the first filter represents a movement of a secondary mass and the second filter or the mechanical resonator represents a movement of a primary mass of a rotation rate sensor.

7. The method of claim 1, wherein the first noise spectrum and the second noise spectrum in the frequency adaptation circuit are determined in a digital domain or in an analog domain.

8. A signal processing device, comprising:
a closed control loop with a first filter having a resonant frequency and a delta sigma modulator; and
a frequency adaptation circuit receiving an output signal of the delta sigma modulator, determining a first noise spectrum of the output signal of the delta sigma modulator in a first frequency band and a second noise spectrum of the output signal of the delta sigma modulator in a second frequency band, the first frequency band and the second frequency band being arranged symmetrically with respect to a given frequency, comparing the first noise spectrum in the first frequency band with the second noise spectrum in the second frequency band, generating an adaptation signal that causes a frequency adaptation of the resonant frequency if the first noise spectrum differs from the second noise spectrum, and outputting the adaptation signal to a control input of the first filter for adapting the resonant frequency to the given frequency in response to the comparison result.

9. The signal processing device of claim 8, wherein the frequency adaptation circuit includes a first demodulator branch and a second demodulator branch that extract the first noise spectrum in the first frequency band and the second noise spectrum in the second frequency band.

10. The signal processing device of claim 9, wherein the first demodulator branch includes a first multiplier multiplying the output signal of the delta sigma modulator with a first comparison frequency that is higher than the given frequency.

11. The signal processing device of claim 10, wherein the second demodulator branch includes a second multiplier multiplying the output signal of the delta sigma modulator with a second comparison frequency that is lower than the given frequency, the first comparison frequency and the second comparison frequency are arranged symmetrically to the given frequency.

12. The signal processing device of claim 11, wherein the frequency adaptation circuit includes an adder and each of the first demodulator branch and the second demodulator branch has a respective squarer, the outputs of the squarers are connected to the adder, which determines a difference between the signals applied to the outputs of the squarer and outputs a differential value.

13. The signal processing device of claim 11, wherein the frequency adaptation circuit includes an adder and each of the first demodulator branch and the second demodulator branch has a respective absolute-value element determining an absolute value, the outputs of the absolute-value elements are connected to the adder, which determines a difference between the signals applied to the outputs of the absolute-value elements and outputs a differential value.

14. The signal processing device of claim 12, further comprising a controller connected to the adder, the controller generating the adaptation signal from the differential value.

15. The signal processing device of claim 11, further comprising an additional closed control loop having a second filter or a mechanical resonator with the given frequency as a further resonant frequency.

16. The signal processing device of claim 15, wherein the additional closed control loop has a phase-locked control loop providing the first comparison frequency and the second comparison frequency.

17. The signal processing device of claim 8, wherein the frequency adaptation circuit determines the first noise spectrum and the second noise spectrum in a digital domain or in an analog domain.

18. A circuit arrangement for reading a capacitive rotation rate sensor, comprising:
a signal processing device including a closed control loop with a first filter having a resonant frequency and a delta sigma modulator, and a frequency adaptation circuit receiving an output signal of the delta sigma modulator, the frequency adaptation circuit determining a first noise spectrum of the output signal of the delta sigma modulator in a first frequency band and a second noise spectrum of the output signal of the delta sigma modulator in a second frequency band, the first frequency band and the second frequency band being arranged symmetrically with respect to a given frequency, comparing the first noise spectrum in the first frequency band with the second noise spectrum in the second frequency band, generating an adaptation signal that causes a frequency adaptation of the resonant frequency if the first noise spectrum differs from the second noise spectrum, and outputting the adaptation signal to a control input of the first filter for adapting the resonant frequency to the given frequency in response to the comparison result; and
a control unit configured to calculate and output a rotation rate signal based on the output signal of the delta sigma modulator.

19. The circuit arrangement of claim 18, wherein the given frequency is a frequency of a primary oscillation of the capacitive rotation rate sensor, the capacitive rotation rate sensor having a primary mass and a secondary mass connected to the primary mass, the primary mass being excited to the primary oscillation during operation and the secondary mass being deflected from a position of rest in a direction transverse to the primary oscillation if the rotation rate sensor rotates about a sensitive axis extending transversely to the direction of the primary oscillation and to the direction of deflection of the secondary mass.

20. A rotation rate sensor, comprising:
a primary mass;
a secondary mass connected to the primary mass, the primary mass being excited to a primary oscillation during operation and the secondary mass being deflected in a direction transverse to the primary oscillation if the rotation rate sensor rotates about a sensitive axis; and
a circuit arrangement for reading a rotation rate signal, the circuit arrangement comprising a signal processing device including:
a closed control loop with a first filter having a resonant frequency and a delta sigma modulator, and a frequency adaptation circuit receiving an output signal of the delta sigma modulator, the frequency adaptation circuit determining a first noise spectrum of the output signal of the delta sigma modulator in a first frequency band and a second noise spectrum of the output signal of the delta sigma modulator in a second frequency band, the first frequency band and the second frequency band being arranged symmetrically with respect to a given frequency, comparing the first noise spectrum in the first frequency band with the second noise spectrum in the second frequency band, generating an adaptation signal that causes a frequency adaptation of the resonant frequency if the first noise spectrum differs from the second noise spectrum, and outputting the adaptation signal to a control input of the first filter for adapting the resonant frequency to the given frequency in response to the comparison result; and a control unit configured to calculate and output the rotation rate signal based on the output signal of the delta sigma modulator.

* * * * *